US008906487B2

(12) United States Patent
Shimada

(10) Patent No.: US 8,906,487 B2
(45) Date of Patent: Dec. 9, 2014

(54) BASE MATERIAL WITH SINGLE-CRYSTAL SILICON CARBIDE FILM, METHOD OF PRODUCING SINGLE-CRYSTAL SILICON CARBIDE FILM, AND METHOD OF PRODUCING BASE MATERIAL WITH SINGLE-CRYSTAL SILICON CARBIDE FILM

(75) Inventor: Hiroyuki Shimada, Chuo (JP)

(73) Assignee: Seiko Epson Corporation, Tokyo (JP)

( * ) Notice: Subject to any disclaimer, the term of this patent is extended or adjusted under 35 U.S.C. 154(b) by 587 days.

(21) Appl. No.: 13/173,646

(22) Filed: Jun. 30, 2011

(65) Prior Publication Data

US 2012/0021173 A1 Jan. 26, 2012

(30) Foreign Application Priority Data

Jul. 22, 2010 (JP) ................................ 2010-164778

(51) Int. Cl.

| | |
|---|---|
| ***B32B 3/24*** | (2006.01) |
| ***B32B 3/30*** | (2006.01) |
| ***C30B 25/02*** | (2006.01) |
| ***C30B 25/04*** | (2006.01) |
| ***C30B 25/18*** | (2006.01) |
| ***H01L 21/20*** | (2006.01) |
| ***H01L 21/205*** | (2006.01) |
| ***C30B 29/36*** | (2006.01) |
| ***H01L 21/02*** | (2006.01) |
| ***C30B 29/06*** | (2006.01) |

(52) U.S. Cl.

CPC ................ *C30B 29/06* (2013.01); *C30B 29/36* (2013.01); *H01L 21/02494* (2013.01); *H01L 21/02488* (2013.01); *H01L 21/0265* (2013.01); *H01L 21/02529* (2013.01); *H01L 21/02381* (2013.01); *C30B 25/02* (2013.01); *H01L 21/0243* (2013.01); *H01L 21/02639* (2013.01); *Y10S 117/913* (2013.01)

USPC ............ 428/138; 428/137; 428/172; 117/94; 117/95; 117/97; 117/106; 117/913; 117/923; 117/951; 257/E21.102; 257/E21.103; 257/E21.104; 257/E21.122; 257/E21.125; 257/E21.133; 257/E21.232; 257/E21.234; 257/E21.258

(58) Field of Classification Search

CPC ........................... C30B 25/183; C30B 25/186

See application file for complete search history.

(56) References Cited

U.S. PATENT DOCUMENTS

| | | | | |
|---|---|---|---|---|
| 5,296,086 A * | 3/1994 | Takasu | ......................... | 438/481 |
| 5,518,953 A * | 5/1996 | Takasu | ......................... | 438/410 |

(Continued)

FOREIGN PATENT DOCUMENTS

| | | |
|---|---|---|
| JP | A-2003-224248 | 8/2003 |

OTHER PUBLICATIONS

Gupta et al., Selective epitaxy and lateral overgrowth of 3C-SiC on Si—A review, 2005 (no month), Progress in Crystal Growth and Characterization of Materials, vol. 51, Issues 1-3, pp. 43-69.*

Camassel, State of the art of 3C-SiC/silicon on insulators, 1998, Journal of Vacuum Science & Technology B, vol. 16, pp. 1648-1654.*

Carter et al., Pendeo Epitaxy of 3C-SiC on Si Substrates, 2000, Mat. Res. Soc. Symp. Proc., vol. 622, pp. T6.3.2-T6.3.6.*

(Continued)

*Primary Examiner* — Aaron Austin
*Assistant Examiner* — Jeff Vonch
(74) *Attorney, Agent, or Firm* — Oliff PLC

(57) ABSTRACT

In a base material with a single-crystal silicon carbide film according to an embodiment of the invention, a plurality of recessed portions is formed on the surface of a silicon substrate, an insulating film including silicon oxide is formed across the surface of the silicon substrate including the inner surfaces of the recessed portions, the top surfaces of side wall portions of recessed portions of the insulating film form flat surfaces, a single-crystal silicon carbide film is joined on the flat surfaces, and the recessed portions below the single-crystal silicon carbide film form holes.

14 Claims, 3 Drawing Sheets

7
11a
6
5 4
2

(56) References Cited

U.S. PATENT DOCUMENTS

| | | | | |
|---|---|---|---|---|
| 6,835,246 | B2 * | 12/2004 | Zaidi | 117/97 |
| 7,405,135 | B2 * | 7/2008 | Letertre et al. | 438/455 |
| 2003/0014586 | A1 | 1/2003 | Mitsuda et al. | |
| 2004/0173154 | A1 | 9/2004 | Izumi et al. | |
| 2008/0044979 | A1 * | 2/2008 | Wells et al. | 438/424 |
| 2013/0037857 | A1 * | 2/2013 | Von Kanel et al. | 257/190 |

OTHER PUBLICATIONS

Nishino et al., Epitaxial Growth of 3C-SiC on T-shape columnar Si Substrates, 2004, Mat. Res. Soc. Symp. Proc., vol. 815, pp. J2.2.1-J2.2.6.*

Ferro et al., Strain Tailoring in 3C-SiC Heteroepitaxial Layers Grown on Si(100), Aug. 2006, Chemical Vapor Deposition, vol. 12, Issue 8-9, pp. 483-488.*

* cited by examiner

BASE MATERIAL WITH SINGLE-CRYSTAL SILICON CARBIDE FILM, METHOD OF PRODUCING SINGLE-CRYSTAL SILICON CARBIDE FILM, AND METHOD OF PRODUCING BASE MATERIAL WITH SINGLE-CRYSTAL SILICON CARBIDE FILM

The entire disclosure of the Japanese Patent Application No. 2010-164778, filed Jul. 22, 2010 is expressly incorporated by reference herein.

BACKGROUND

1. Technical Field

The present invention relates to a base material with a single-crystal silicon carbide film having a single-crystal silicon carbide film which is a wide bandgap semiconductor material formed on a silicon substrate or on a single-crystal silicon film formed on a substrate, a method of producing a single-crystal silicon carbide film, and a method of producing a base material with a single-crystal silicon carbide film, and, particularly to a base material with a single-crystal silicon carbide film having a cubic silicon carbide thin film formed on a silicon substrate, a method of producing a single-crystal silicon carbide film in which a cubic silicon carbide thin film is formed on a silicon substrate, and a method of producing a base material with a single-crystal silicon carbide film.

2. Related Art

Due to having large aperture, high quality, and a low price, single-crystal silicon has been used as a substrate for growing the single crystals of many materials.

Among the materials, cubic silicon carbide (3C-SiC) which is a wide bandgap semiconductor material with a wide bandgap of 2.2 eV (300 K) is expected to be a semiconductor material for next generation low-loss power devices and, particularly, is considered extremely useful from the standpoint of the possibility of single crystal growth (heteroepitaxy) on a low-cost silicon substrate.

Incidentally, since the lattice constant of cubic silicon carbide is 4.359 angstroms and is thus about 20% smaller than the lattice constant of cubic silicon (5.4307 angstroms), it is likely that many voids or misfit dislocations will occur in epitaxially grown cubic silicon carbide, and thus it is difficult to grow high-grade cubic silicon carbide.

Therefore, as a method of alleviating the difference in the lattice constant (lattice mismatch) between a silicon substrate and cubic silicon carbide, a method using a Silicon On Insulator (SOI) structure is suggested (JP-A-2003-224248).

In this method, an SOI substrate having a buried insulator (I layer) composed of a surface silicon layer (Si layer) with a predetermined thickness and silicon oxide is placed in a heating furnace, and the atmospheric temperature in the heating furnace is elevated while a mixed gas of hydrogen gas and a hydrocarbon-based gas is supplied to the heating furnace, thereby modifying the surface silicon layer on the SOI substrate to a single-crystal silicon carbide film. In this method, since all of the thin surface silicon layer is carbonized, and thus the produced single-crystal silicon carbide film is physically separated from the single-crystal silicon substrate and comes into contact with the buried insulator (I layer) that is liable to soften, it is possible to alleviate lattice mismatch-induced stress and also to form a single-crystal silicon carbide film for which crystal defects are suppressed.

However, in the above method using the SOI structure in the related art, it is necessary to make the film thickness as thin as about 10 nm or less in order to carbonize all of the surface silicon layer, but it is difficult to form a surface silicon layer having such a film thickness on the buried insulating layer, and thus there is a problem in that it is not easy to manufacture a substrate having such an SOI structure that is excellent in terms of uniformity.

In addition, the single-crystal silicon carbide film is not in contact with the single-crystal silicon substrate, but is still in contact with the buried insulating layer made of silicon oxide, and therefore there are problems in that silicon oxide has difficulty in sufficiently softening in the vicinity of 1100° C. which is the temperature at which the single-crystal silicon carbide film grows, and it is not possible to sufficiently develop the effect of stress alleviation.

As such, there has been demand for a single-crystal silicon carbide film and a method of producing a single-crystal silicon carbide film, in which the influence of stress induced by lattice mismatch on the single-crystal silicon carbide film is reduced in order to grow a sufficiently high-grade single-crystal silicon carbide film during epitaxy.

SUMMARY

An advantage of some aspects of the invention is to provide a base material with a single-crystal silicon carbide film having a high-grade single-crystal silicon carbide film, for which the influence of stress induced by the lattice mismatch with a single-crystal silicon film formed on a silicon substrate or a substrate is reduced, and crystal defects are suppressed, a method of producing a single-crystal silicon carbide film capable of forming a high-grade single-crystal silicon carbide film, for which crystal defects are suppressed, and a method of producing a base material with a single-crystal silicon carbide film.

The invention provides a base material with a single-crystal silicon carbide film, a method of producing a single-crystal silicon carbide film, and a method of producing a base material with a single-crystal silicon carbide film below.

That is, an aspect of the invention is directed to a base material with a single-crystal silicon carbide film having a single-crystal silicon carbide film formed on a silicon substrate or on a single-crystal silicon film formed on a substrate, in which an insulating film including silicon oxide formed on the silicon substrate or the single-crystal silicon film and the single-crystal silicon carbide film formed on the insulating film are included; a plurality of recessed portions formed from the surface of the silicon substrate or the surface of the single-crystal silicon film is disposed on the silicon substrate or the single-crystal silicon film; and the insulating film is disposed over the plurality of recessed portions, and the single-crystal silicon carbide film is disposed on the top end of the insulating film, thereby including a plurality of holes surrounded by the insulating film and the single-crystal silicon carbide film over the plurality of recessed portions.

In this base material with a single-crystal silicon carbide film, a plurality of recessed portions formed from the surface of the silicon substrate or the surface of the single-crystal silicon film may be disposed on the silicon substrate or the single-crystal silicon film, and an insulating film may be disposed on the plurality of recessed portions so that the insulating film is formed on the inner surfaces of the plurality of recessed portions. As a result, the single-crystal silicon carbide film is supported only by the insulating film made of silicon oxide, thereby forming an SOI structure in which the single-crystal silicon carbide film is formed on the surface of the silicon substrate or the surface of the single-crystal silicon film via the insulating film made of silicon oxide.

In this SOI structure, since the insulating film made of silicon oxide works as a buffer layer, it is possible to reduce the influence of the lattice constant of the silicon substrate or the single-crystal silicon film in the single-crystal silicon carbide film.

In addition, since non-SOI structure areas have a Silicon On Nothing (SON) structure in which the insulating film having the recessed portions that act as the holes becomes dominant, it is possible to enhance the effect of stress alleviation even without softening the insulating film much, and therefore to reduce the influence of stress induced by the lattice mismatch with the surface of the silicon substrate or the surface of the single-crystal silicon film by the insulating film, thereby suppressing crystal defects in the single-crystal silicon carbide film formed thereon. As a result, it is possible to provide a base material with a single-crystal silicon carbide film having a single-crystal silicon carbide film for which crystal defects are suppressed.

Furthermore, the SON structure areas will be in an Epitaxial Lateral Overgrowth (ELO) state in which the crystals of silicon carbide are grown laterally, and since parts of the crystals are grown laterally in the ELO state, it is possible to suppress defects propagating in a direction perpendicular to the interfaces and to effectively suppress the occurrence of crystal defects.

As a result, it becomes possible to form a high-quality single-crystal silicon carbide film on the surface of the silicon substrate or the surface of the single-crystal silicon film and to realize a large-area base material with a single-crystal silicon carbide film.

In the base material with a single-crystal silicon carbide film, the single-crystal silicon carbide film may be a thin film including cubic silicon carbide.

In the base material with a single-crystal silicon carbide film, it is possible to further suppress crystal defects in a cubic silicon carbide thin film which is a wide bandgap semiconductor material by using a thin film including cubic silicon carbide as the single-crystal silicon carbide film. As a result, it is possible to provide a base material with a single-crystal silicon carbide film having a single-crystal silicon carbide film for which crystal defects are further suppressed.

Another aspect of the invention is directed to a method of producing a single-crystal silicon carbide film in which a single-crystal silicon carbide film is formed on the surface of a silicon substrate or the surface of a single-crystal silicon film formed on a substrate, including a process in which a silicon carbide layer is formed on the surface of the silicon substrate or the surface of the single-crystal silicon film; a process in which the silicon carbide layer is selectively removed; a process in which the silicon substrate or the single-crystal silicon film is selectively removed using the silicon carbide layer as a mask, and a plurality of recessed portions is formed from the surface of the silicon substrate or the surface of the single-crystal silicon film; a process in which an insulating film including silicon oxide on the silicon substrate or the single-crystal silicon film is formed by performing thermal oxidation from the surface of the silicon substrate or the surface of the single-crystal silicon film including the surfaces of the plurality of recessed portions; and a process in which single-crystal silicon carbide is grown on the top end of the insulating film so as to form the single-crystal silicon carbide film on the insulating film and also to form holes surrounded by the insulating film and the single-crystal silicon carbide film.

The method may include a process in which the insulating film is selectively removed after the process in which the insulating film is formed.

In the method of producing a single-crystal silicon carbide film, the silicon substrate or the single-crystal silicon film is selectively removed using a patterned silicon carbide layer as a mask; a plurality of recessed portions is formed from the surface of the silicon substrate or the surface of the single-crystal silicon film; subsequently, an insulating film including silicon oxide on the silicon substrate or the single-crystal silicon film is formed by performing thermal oxidation from the surface of the silicon substrate or the surface of the single-crystal silicon film including the surfaces of the plurality of recessed portions; and subsequently, single-crystal silicon carbide is grown on the top end of the insulating film so as to form the single-crystal silicon carbide film on the insulating film and also to form holes surrounded by the insulating film and the single-crystal silicon carbide film.

Thereby, it is possible to enhance the effect of stress alleviation even without softening much the insulating film that is formed on the surface of the silicon substrate or the surface of the single-crystal silicon film and the inner surfaces of the plurality of recessed portions. Therefore, it is possible to reduce the influence of stress induced by the lattice mismatch with the surface of the silicon substrate or the surface of the single-crystal silicon film in the insulating film, and thus to produce a base material with a single-crystal silicon carbide film having a single-crystal silicon carbide film for which crystal defects in the single-crystal silicon carbide film formed thereon can be suppressed.

In the method of producing a single-crystal silicon carbide film of the aspect of the invention, the silicon carbide layer may be formed by a gas including monomethylsilane as the main component.

In the method of producing a single-crystal silicon carbide film, since the silicon carbide layer is formed by a gas including monomethylsilane as the main component, the produced film of the silicon carbide layer is homogenized, and the number of defects or the like is also small. Thereby, it is possible to form a silicon carbide layer that includes no defects or the like and is homogenized.

In the method of producing a single-crystal silicon carbide film of the aspect of the invention, a gas including nitrogen trifluoride as the main component may be used for the selective removal of the silicon carbide layer.

In the method of producing a single-crystal silicon carbide film, since a gas including nitrogen trifluoride as the main component is used for the selective removal of the silicon carbide layer, the patterning accuracy is improved for the silicon carbide layer, and, consequently, the working accuracy for the plurality of recessed portions formed on the surface of the silicon substrate or the surface of the single-crystal silicon film using this patterned silicon carbide layer as a mask is also improved.

In the method of producing a single-crystal silicon carbide film of the aspect of the invention, a gas including carbon tetrafluoride or sulfur hexafluoride as the main component may be used for the selective removal of the surface of the silicon substrate or the surface of the single-crystal silicon film.

In the method of producing a single-crystal silicon carbide film, since a gas including carbon tetrafluoride or sulfur hexafluoride as the main component is used for the selective removal of the surface of the silicon substrate or the surface of the single-crystal silicon film, the working accuracy for the recessed portions formed on the surface of the silicon substrate or the surface of the single-crystal silicon film is improved.

In the method of producing a single-crystal silicon carbide film of the aspect of the invention, a gas including monomethylsilane as the main component may be used for the growth of the single-crystal silicon carbide.

In the method of producing a single-crystal silicon carbide film, since a gas including monomethylsilane as the main component is used for the growth of the single-crystal silicon carbide, it is possible to grow a single-crystal silicon carbide film for which the occurrence of crystal defects is suppressed on the insulating film. As a result, it becomes possible to form a higher-quality single-crystal silicon carbide film.

Still another aspect of the invention is directed to a method of producing a base material with a single-crystal silicon carbide film including the methods of producing a single-crystal silicon carbide film of the aspect of the invention.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments to carry out the base material with a single-crystal silicon carbide film and the method of producing a single-crystal silicon carbide film according to the invention will be described.

In the present embodiments, the shapes or the like of the respective portions in the structure are appropriately differentiated from the actual shapes to facilitate description of the invention.

Figure 1:
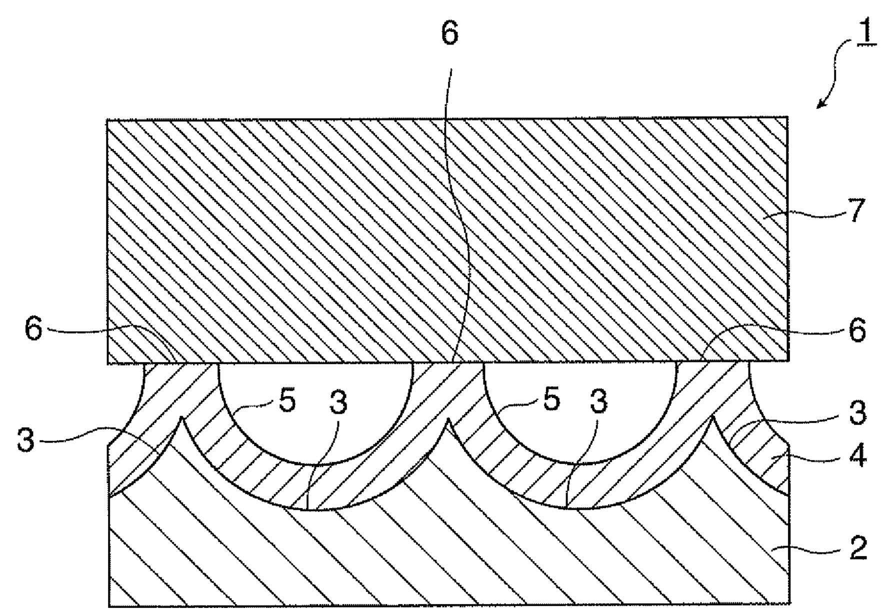
FIG. 1 is a cross-sectional view showing a base material with a single-crystal silicon carbide film according to an embodiment of the invention.

FIG. 1 is a cross-sectional view showing a base material with a single-crystal silicon carbide film according to an embodiment of the invention.

In the base material with a single-crystal silicon carbide film 1, a plurality of recessed portions 3 is formed to be adjacent to one another on the surface of a silicon substrate 2, an insulating film 4 including silicon oxide is formed on the recessed portions 3, and the top surfaces of the side wall portion of the recessed portions 5 formed on the insulating film 4 form flat surfaces 6.

The shape of the recessed portion 3 is appropriately selected according to necessity from a line shape, an island shape, or the like.

In addition, a single-crystal silicon carbide film 7 made of thick cubic silicon carbide (3C-SiC) is joined on the flat surfaces 6, and the recessed portions 5 below the single-crystal silicon carbide film 7 form holes.

In the base material with a single-crystal silicon carbide film 1, the insulating film 4 made of silicon oxide is formed on the plurality of recessed portions 3 so that the single-crystal silicon carbide film 7 formed on the insulating film 4 is supported only by the insulating film 4, thereby forming an SOI structure in which the single-crystal silicon carbide film 7 is formed on the surface of the silicon substrate 2 via the insulating film 4.

In this SOI structure, since the insulating film 4 acts as a buffer layer between the silicon substrate 2 and the single-crystal silicon carbide film 7, the influence of the lattice constant of the silicon substrate 2 is reduced in the single-crystal silicon carbide film 7.

The thickness of the insulating film 4 is not particularly limited as long as the thickness can sufficiently secure the SOI structure, but is favorably about 300 nm in consideration of the electrical properties of the SOI structure.

In addition, the width of the flat surface 6 that belongs to the side wall portion of the recessed portions 5 of the insulating film 4 needs to be large enough to have mechanical strength that can sufficiently secure the SOI structure, and is favorably about 500 nm in consideration of the mechanical strength between the insulating film 4 and the silicon substrate 2 and the insulating film 4 and the single-crystal silicon carbide film 7.

In addition, since non-SOI structure areas have a Silicon On Nothing (SON) structure in which the insulating film 4 having the recessed portions 5 that act as the holes becomes dominant, the effect of stress alleviation of the insulating film 4 is enhanced even when the insulating film 4 is not significantly softened, and thus the influence of stress induced by the lattice mismatch with the surface of the silicon substrate 2 in the insulating film 4 is reduced. Thereby, crystal defects in the single-crystal silicon carbide film 7 formed on the insulating film 4 are suppressed, and therefore it becomes possible to provide the base material with a single-crystal silicon carbide film 1 having a single-crystal silicon carbide film 7 for which crystal defects are suppressed.

Furthermore, the SON structure areas will be in an Epitaxial Lateral Overgrowth (ELO) state in which the crystals of silicon carbide are grown laterally so as to face the top of the recessed portion 5 from the top of the flat surface 6, and since parts of the crystals are grown laterally in the ELO state, defects propagating in a direction perpendicular to the interfaces are suppressed, and thus the occurrence of crystal defects is effectively suppressed.

As a result, it becomes possible to form the high-quality single-crystal silicon carbide film 7 on the surface of the silicon substrate 2 and to realize the large-area base material with a single-crystal silicon carbide film 1.

Next, a method of producing the base material with a single-crystal silicon carbide film 1 will be described based on FIGS. 2A to 3C.

Figure 2A:
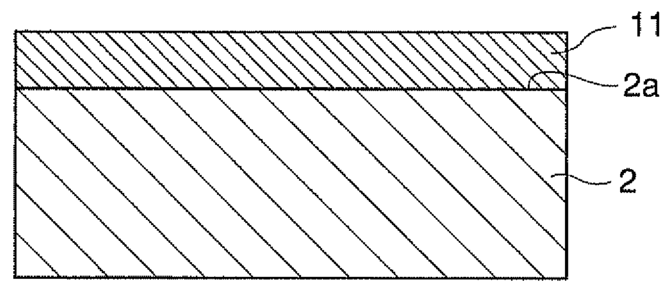
FIGS. 2A to 2C are process diagrams showing the procedure of a method of producing a base material with a single-crystal silicon carbide film according to an embodiment of the invention.

As shown in FIG. 2A, firstly, the washed silicon substrate 2 is introduced in the chamber of a chemical vapor deposition (CVD) apparatus for epitaxy, and next, the chamber is sufficiently evacuated to a vacuum using a vacuum pump, and then the silicon substrate 2 is heated to, for example, 600° C. Subsequently, in a state in which the temperature of the surface of the silicon substrate 2 is maintained at 600° C., monomethylsilane gas is introduced to the silicon substrate 2 at a flow rate of 3.0 sccm, and the silicon substrate 2 is heated while the flow rate is retained, thereby elevating the surface temperature thereof to, for example, 1050° C., and then is maintained at 1050° C. for 180 minutes. Thereby, a single-crystal silicon carbide sheet layer 11 made of 300 nm-thick cubic silicon carbide (3C-SiC) is formed across the surface 2*a* of the silicon substrate 2.

Figure 2B:
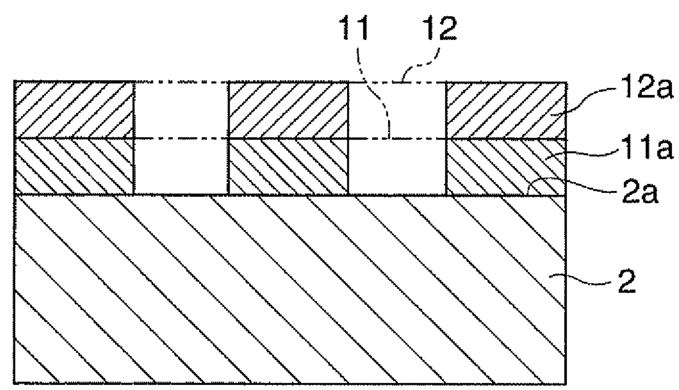

Next, as shown in FIG. 2B, a resist 12 is coated on the single-crystal silicon carbide sheet layer 11, and the resist 12 is patterned into a desired pattern, for example, a line shape with a width of 1 μm L/S by the photolithography method.

Using the resist 12*a* patterned in the above manner as a mask, dry etching is performed on the single-crystal silicon carbide sheet layer 11 using $NF_3$ gas. Thereby, the single-crystal silicon carbide sheet layer 11 is perpendicularly processed in a desired pattern so as to become the single-crystal silicon carbide sheet layer 11*a* patterned into the desired pattern, whereby a part of the surface 2*a* of the silicon substrate 2 is exposed through the openings in the single-crystal silicon carbide sheet layer 11*a*.

Figure 2C:
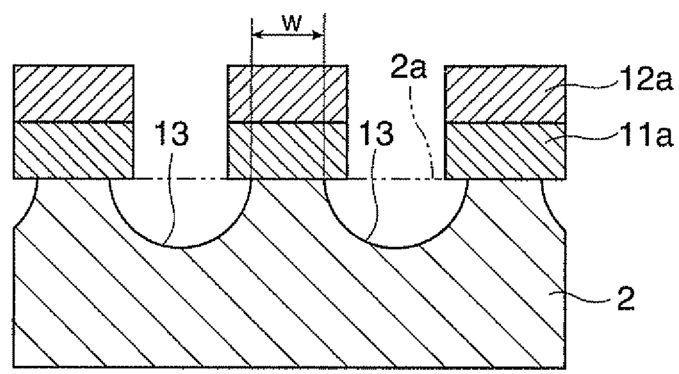

Next, as shown in FIG. 2C, using the patterned resist 12*a* and the patterned single-crystal silicon carbide sheet layer 11*a* as masks, dry etching is performed using a gas including carbon tetrafluoride ($CF_4$) or sulfur hexafluoride ($SF_6$) as the main component on the exposed surface 2*a* of the silicon substrate 2 so as to etch the exposed surface 2*a* in an isotropic manner. Thereby, recessed portions 13 with a semicircular cross-sectional shape are formed on the exposed surface 2*a* of the silicon substrate 2, and also the width W of the silicon remaining under the resist 12*a* as a mask and the single-crystal silicon carbide sheet layer 11*a* are made to be, for example, 600 nm.

Figure 3A:
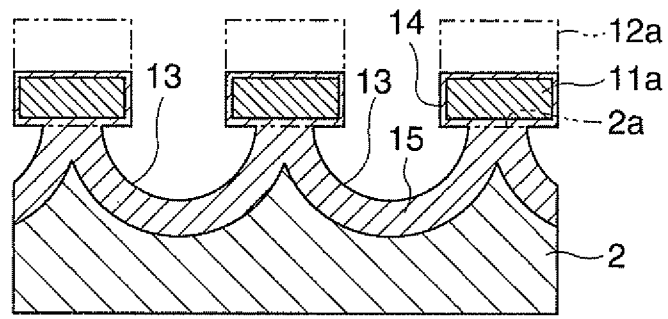
FIGS. 3A to 3C are process diagrams showing the procedure of a method of producing a base material with a single-crystal silicon carbide film according to an embodiment of the invention.

Next, as shown in FIG. 3A, after the resist 12*a* is removed, the silicon substrate 2 is introduced into a thermal oxidation furnace, and the surface of the single-crystal silicon carbide sheet layer 11, the surface 2*a* of the silicon substrate 2 under the single-crystal silicon carbide sheet layer 11*a* and the inner surface of the recessed portions 13, which are the exposed portions, are oxidized by, for example, the water vapor thermal oxidation method using water vapor of 1050° C., and an insulating film 14 and an insulating film 15 are formed on the surface of the single-crystal silicon carbide sheet layer 11*a* and the surface 2*a* of the silicon substrate 2 under the single-crystal silicon carbide sheet layer 11*a* and the inner surfaces of the recessed portions 13, respectively.

In the water vapor thermal oxidation method, since it is difficult to oxidize the surface of the single-crystal silicon carbide sheet layer 11*a*, and it is easy to oxidize the surface 2*a* of the silicon substrate 2 under the single-crystal silicon carbide sheet layer 11*a* and the inner surfaces of the recessed portions 13, the thickness of the insulating film 14 on the surface of the single-crystal silicon carbide sheet layer 11*a* becomes thin in comparison to the thickness of the insulating film 15 formed on the surface 2*a* of the silicon substrate under the single-crystal silicon carbide sheet layer 11*a* and the inner surfaces of the recessed portions 13.

As examples of the specific numeric values of the thicknesses, the thickness of the insulating film 14 formed on the single-crystal silicon carbide sheet layer 11*a* is about 50 nm, and the thickness of the insulating film 15 formed on the surface 2*a* of the silicon substrate 2 under the single-crystal silicon carbide sheet layer 11*a* and the inner surfaces of the recessed portions 3 is about 600 nm.

Herein, the insulating film 15 growing from the surfaces of the recessed portions 13 adjacent to each other is combined under the single-crystal silicon carbide sheet layer 11*a* so that the plurality of recessed portions 13 is covered, and also the single-crystal silicon carbide sheet layer 11*a* is mounted on the insulating film 15.

Figure 3B:
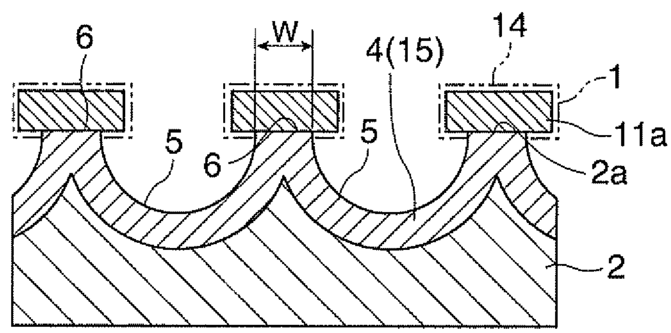

Next, as shown in FIG. 3B, the insulating film 14 on the surface of the single-crystal silicon carbide sheet layer 11 is removed by wet etching using a 5%; aqueous solution of hydrogen fluoride (HF), and also the thickness of the insulating film 15 formed on the surface 2*a* of the silicon substrate 2 under the single-crystal silicon carbide sheet layer 11*a* and the inner surfaces of the recessed portions 13 is prepared.

In the wet etching, since the thickness of the insulating film 14 on the surface of the single-crystal silicon carbide sheet layer 11*a* is thin in comparison to the thickness of the insulating film 15 formed on the surface 2*a* of the silicon substrate 2 under the single-crystal silicon carbide sheet layer 11*a* and the inner surfaces of the recessed portions 13, the insulating film 14 becomes completely removed from the single-crystal silicon carbide sheet layer 11*a* while the thickness of the insulating film 15 becomes thin so that there is no case in which the insulating film 14 remains on the surface of the single-crystal silicon carbide sheet layer 11*a*.

The insulating film 15 having a predetermined thickness prepared by wet etching in the above manner becomes the insulating film 4, and the width W' of the flat surface 6 which is the top surface of the side wall portion of the recessed portions 5 of the insulating film 4 is prepared to be about 500 nm in order to secure mechanical strength large enough to sufficiently secure the SOI structure.

Figure 3C:
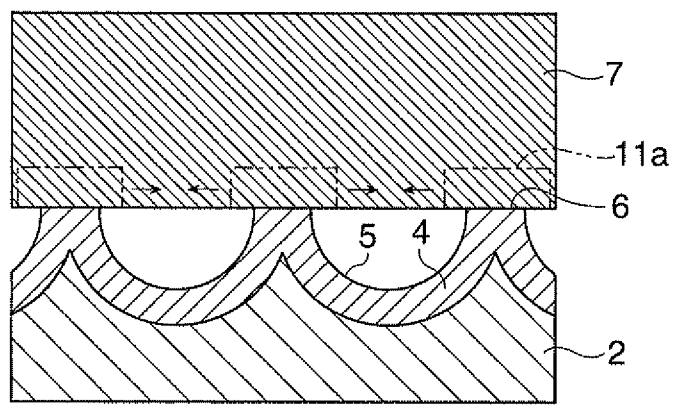

The silicon substrate 2 having the single-crystal silicon carbide sheet layer 11*a* and the insulating film 4 produced in the above manner is again introduced to the chamber of the chemical vapor deposition (CVD) apparatus for epitaxy, and next, the chamber is sufficiently evacuated to a vacuum using the vacuum pump, and then the substrate temperature is elevated to, for example, 1050° C., and monomethylsilane gas is introduced at a flow rate of 3.0 sccm in a state in which the surface temperature of the substrate is maintained at 1050° C. In addition, as shown in FIG. 3C, while the flow rate of the monomethylsilane gas is maintained, single-crystal silicon carbide made of cubic silicon carbide (3C-SiC) is grown to a desired film thickness from the single-crystal silicon carbide sheet layer 11*a* as a nucleus, thereby producing a single-crystal silicon carbide film 7.

In the growing process of the single-crystal silicon carbide, since an Epitaxial Lateral Overgrowth (ELO) state is formed in which the crystals of silicon carbide are grown laterally so as to face the top of the recessed portion 5 from the top of the flat surface 6, parts of the single crystals are grown laterally from the single-crystal silicon carbide sheet layer 11*a*, and thus vertical defects are suppressed. As a result, it becomes possible to effectively suppress the occurrence of crystal defects in a growing single-crystal silicon carbide and thus to form a high-quality single-crystal silicon carbide film 7 on the surface of the silicon substrate 2.

Thereby, it is possible to produce the base material with a single-crystal silicon carbide film 1 having the single-crystal silicon carbide film 7 joined on the top of the silicon substrate 2 including the recessed portions 5 that have been made as holes.

As described above, according to the base material with a single-crystal silicon carbide film 1 of the embodiment, since the plurality of recessed portions 3 is formed to be adjacent to one another on the surface of the silicon substrate 2, the insulating film 4 made of silicon oxide is formed on the recessed portions 3, the single-crystal silicon carbide film 7 is joined on the flat surfaces 6 of the side walls of the recessed portions 5 of the insulating film 4, and the recessed portion 5 below the single-crystal silicon carbide film 7 are holes, the SOI structure is formed in which the single-crystal silicon carbide film 7 is formed on the surface of the silicon substrate 2 via the insulating film 4 so that the insulating film 4 acts as a buffer layer, whereby it is possible to reduce the influence of stress induced by the lattice mismatch with the surface of the silicon substrate 2 by the insulating film 4, and thus to suppress crystal defects in the single-crystal silicon carbide film 7 formed on the insulating film 4. As a result, it is possible to produce the base material with a single-crystal silicon carbide film 1 having the single-crystal silicon carbide film 7 for which crystal defects are suppressed.

According to the method of producing the base material with a single-crystal silicon carbide film 1 of the embodiment, since the plurality of recessed portions 3 are formed to be adjacent to one another on the surface 2*a* of the silicon substrate 2 by dry etching using the single-crystal silicon carbide sheet layer 11*a* as a mask, and next, the insulating film 15 is formed on the surface 2*a* of the silicon substrate 2 under the single-crystal silicon carbide sheet layer 11*a* and the inner surfaces of the recessed portions 3 by the water vapor thermal oxidation method, and next, the thickness of the insulating film 15 is prepared to produce the insulating film 4, and next, single-crystal silicon carbide is grown to a desired film thickness from the single-crystal silicon carbide sheet layer 11*a* as a nucleus, thereby producing the single-crystal silicon carbide film 7, it is possible to produce the base material with a single-crystal silicon carbide film 1 having the single-crystal silicon carbide film 7 for which crystal defects are suppressed.

Meanwhile, in the base material with a single-crystal silicon carbide film 1 of the embodiment, the SOI structure is formed in which the single-crystal silicon carbide film 7 is formed on the surface of the silicon substrate 2 via the insulating film 4, but, even when a substrate having a single-crystal silicon film formed on the surface is used instead of the silicon substrate 2, the same actions and effects can be obtained.

In this case, the thickness of the single-crystal silicon film needs to be thick enough to form the recessed portions 5 on the insulating film 4.

In addition, if a gallium nitride (GaN) single crystal film is epitaxially grown on the single-crystal silicon carbide film 7, it is possible to realize an extremely high quality gallium nitride (GaN) single-crystal film.

Furthermore, the base material with a single-crystal silicon carbide film 1 can also be used as a semiconductor material for next generation low-loss power devices.

What is claimed is:

1. A base material with a single crystal silicon carbide film, comprising:

an insulating film including silicon oxide disposed on a silicon substrate or a single crystal silicon film on a substrate;

the single crystal silicon carbide film disposed on the insulating film, the insulating film being disposed on a plurality of recessed portions of the silicon substrate or the single crystal silicon, the single crystal silicon carbide film being disposed on the top end of the insulating film and the single crystal silicon carbide film being supported only by the insulating film, and a plurality of holes being surrounded by the insulating film and the single-crystal silicon carbide film, wherein the plurality of recessed portions are formed from the surface of the silicon substrate or the surface of the single crystal silicon film by selectively removing the silicon substrate or the single crystal silicon film.

2. The base material with a single-crystal silicon carbide film according to claim 1, the single crystal silicon carbide film being a thin film including cubic silicon carbide.

3. A method of producing a single crystal silicon carbide film, comprising:

forming a first silicon carbide layer on a surface of a silicon substrate or a surface of a single crystal silicon film;

forming a second silicon carbide layer by selectively removing the first silicon carbide layer;

forming a plurality of recessed portions from the surface of the silicon substrate or the surface of the single crystal silicon film by selectively removing the silicon substrate or the single crystal silicon film using the second silicon carbide layer as a mask;

forming an insulating film including silicon oxide on the silicon substrate or the single crystal silicon film by performing thermal oxidation of the plurality of recessed portions; and forming a single crystal silicon carbide film on the insulating film, a plurality of holes surrounded by the insulating film and the single crystal silicon carbide film being formed by the forming the single crystal silicon carbide film, and the single crystal silicon carbide film is supported only by the insulating film.

4. The method of producing a single crystal silicon carbide film according to claim 3, further comprising:

selectively removing the insulating film after forming the insulating film.

5. The method of producing a single crystal silicon carbide film according to claim 3, the first silicon carbide layer being formed by using a gas including monomethylsilane.

6. The method of producing a single crystal silicon carbide film according to claim 3, the forming the second silicon carbide layer being performed by using a gas including nitrogen trifluoride.

7. The method of producing a single crystal silicon carbide film according to claim 3, the forming the plurality of recessed portions being performed by using a gas including carbon tetrafluoride or sulfur hexafluoride.

8. The method of producing a single crystal silicon carbide film according to claim 3, forming a single crystal silicon carbide film being performed by using a gas including monomethylsilane.

9. A method of producing a base material with a single crystal silicon carbide film, comprising the method of producing a single crystal silicon carbide film according to claim 3.

10. A method of producing a base material with a single crystal silicon carbide film, comprising the method of producing a single crystal silicon carbide film according to claim 4.

11. A method of producing a base material with a single crystal silicon carbide film, comprising the method of producing a single crystal silicon carbide film according to claim 5.

12. A method of producing a base material with a single crystal silicon carbide film, comprising the method of producing a single crystal silicon carbide film according to claim 6.

13. A method of producing a base material with a single crystal silicon carbide film, comprising the method of producing a single crystal silicon carbide film according to claim 7.

14. A method of producing a base material with a single crystal silicon carbide film, comprising the method of producing a single crystal silicon carbide film according to claim 8.

* * * * *